US010224108B2

(12) United States Patent
Ching et al.

(10) Patent No.: US 10,224,108 B2
(45) Date of Patent: Mar. 5, 2019

(54) NON-VOLATILE MEMORY

(71) Applicant: eMemory Technology Inc., Hsin-Chu (TW)

(72) Inventors: Wen-Hao Ching, Zhubei (TW); Shih-Chen Wang, Taipei (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 15/860,786

(22) Filed: Jan. 3, 2018

(65) Prior Publication Data
US 2018/0197872 A1 Jul. 12, 2018

Related U.S. Application Data

(60) Provisional application No. 62/444,379, filed on Jan. 10, 2017.

(51) Int. Cl.
G11C 16/14 (2006.01)
H03K 19/088 (2006.01)
(Continued)

(52) U.S. Cl.
CPC .......... G11C 16/14 (2013.01); G11C 7/04 (2013.01); G11C 7/109 (2013.01); G11C 7/1084 (2013.01); G11C 16/0433 (2013.01); G11C 16/0441 (2013.01); G11C 16/12 (2013.01); G11C 16/26 (2013.01); G11C 16/3472 (2013.01); H01L 27/11524 (2013.01); H01L 27/11541 (2013.01); H01L 27/11558 (2013.01); H01L 29/42328 (2013.01); H01L 29/7841 (2013.01);
(Continued)

(58) Field of Classification Search
CPC . G11C 16/10; G11C 16/0433; G11C 16/0483; G11C 16/0441; G11C 11/22; G11C 11/5621; G11C 11/5628; G11C 11/5642; G11C 14/0018; G11C 16/3454; G11C 16/3459; G11C 16/0416; G11C 16/28; G11C 2207/104; G11C 2216/10; G11C 14/00; G11C 16/26; G11C 11/404
USPC ............ 365/185.18, 185.05, 185.29, 185.08, 365/185.03, 185.13, 185.21, 185.26, 149, 365/185.14, 185.19, 189.09, 145, 175, 365/185.25, 185.2, 203, 185.11, 185.17
See application file for complete search history.

(56) References Cited

U.S. PATENT DOCUMENTS 6,636,442 B2 10/2003 Rowlandson et al.
6,927,997 B2 8/2005 Lee et al.
(Continued)

Primary Examiner — Thong Q Le
(74) Attorney, Agent, or Firm — WPAT, PC

(57) ABSTRACT

A non-volatile memory includes a first memory cell. The first memory cell includes five transistors and a first capacitor. The first transistor includes a first gate, a first terminal and a second terminal. The second transistor includes a second gate, a third terminal and a fourth terminal. The third transistor includes a third gate, a fifth terminal and a sixth terminal. The fourth transistor includes a fourth gate, a seventh terminal and an eighth terminal. The fifth transistor includes a fifth gate, a ninth terminal and a tenth terminal. The first capacitor is connected between the third gate and a control line. The third gate is a floating gate. The second terminal is connected with the third terminal. The fourth terminal is connected with the fifth terminal. The sixth terminal is connected with the seventh terminal. The eighth terminal is connected with the ninth terminal.

15 Claims, 8 Drawing Sheets

(51) Int. Cl.
| | |
|---|---|
| *H01L 27/11541* | (2017.01) |
| *G11C 7/04* | (2006.01) |
| *G11C 7/10* | (2006.01) |
| *G11C 16/12* | (2006.01) |
| *G11C 16/04* | (2006.01) |
| *H01L 27/11558* | (2017.01) |
| *H01L 29/423* | (2006.01) |
| *G11C 16/26* | (2006.01) |
| *H01L 27/11524* | (2017.01) |
| *G11C 16/34* | (2006.01) |
| *H01L 29/78* | (2006.01) |
| *H03K 17/082* | (2006.01) |
| *H01L 29/788* | (2006.01) |

(52) U.S. Cl.
CPC ...... *H03K 19/088* (2013.01); *H01L 29/42364* (2013.01); *H01L 29/7883* (2013.01); *H03K 17/0828* (2013.01)

(56) References Cited

U.S. PATENT DOCUMENTS

| | | | |
|---|---|---|---|
| 9,171,627 B2 | 10/2015 | Lee et al. | |
| 9,508,447 B2 | 11/2016 | Hsu | |
| 2005/0190600 A1* | 9/2005 | Arai | G11C 16/0483 365/185.14 |

\* cited by examiner

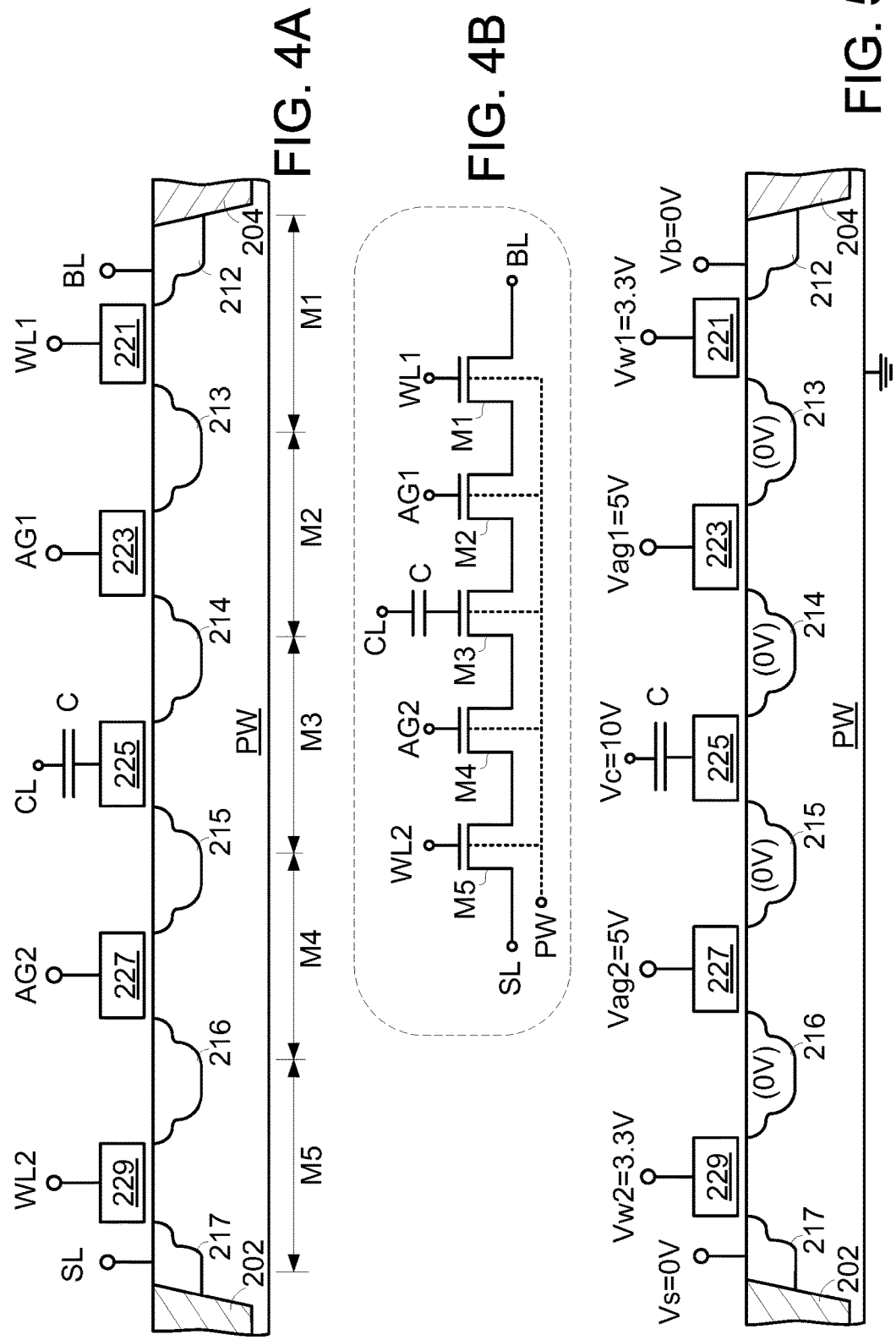

| | CL/NW1 | WL2 | AG2 | WL1 | AG1 | EL/NW2 | BL | SL | PW |
|---|---|---|---|---|---|---|---|---|---|
| PGM | Vpp | Vp1 | Vp2 | Vp3 | Vp4 | Vpp | 0V | 0V | 0V |
| PGM inhibit | Vpp | Vi1 | Vi2 | Vi3 | Vi4 | Vpp | Vi5 | Vi6 | 0V |
| ERS | 0V | Ve1 | Ve2 | Ve3 | Ve4 | Vee | 0V | 0V | 0V |
| READ | Vr5 | Vr1 | Vr2 | Vr3 | Vr4 | Vr6 | Vrr | 0V | 0V |
FIG. 7C
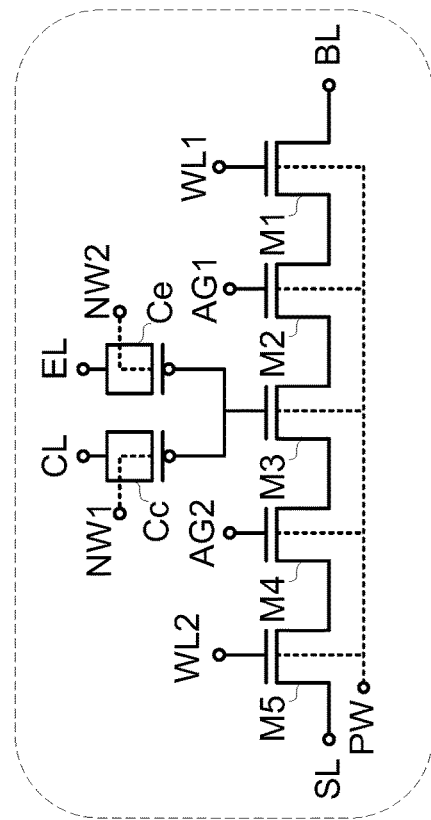
FIG. 7B
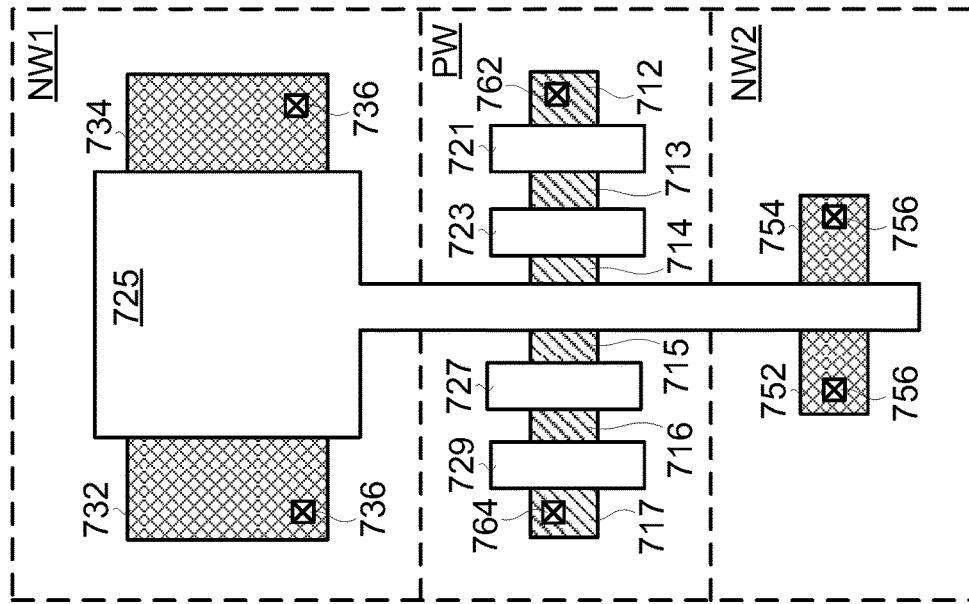
FIG. 7A

| | CL/PW2 | WL2/AG2 | WL1 | AG1 | EL/NW | BL | SL | PW1 | DNW |
|---|---|---|---|---|---|---|---|---|---|
| PGM | Vpp | Vp1 | Vp3 | Vp4 | Vpp | 0V | 0V | 0V | Vpp |
| PGM inhibit | Vpp | Vi1 | Vi3 | Vi4 | Vpp | Vi5 | Vi6 | 0V | Vpp |
| ERS | 0V | Ve1 | Ve3 | Ve4 | Vee | 0V | 0V | 0V | Vee |
| READ | Vr5 | Vr1 | Vr3 | Vr4 | Vr6 | Vrr | 0V | 0V | Vr6 |
FIG. 8C
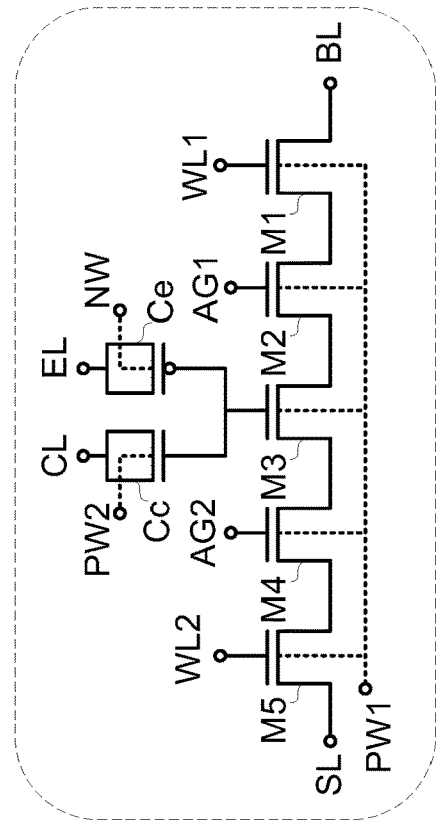
FIG. 8B
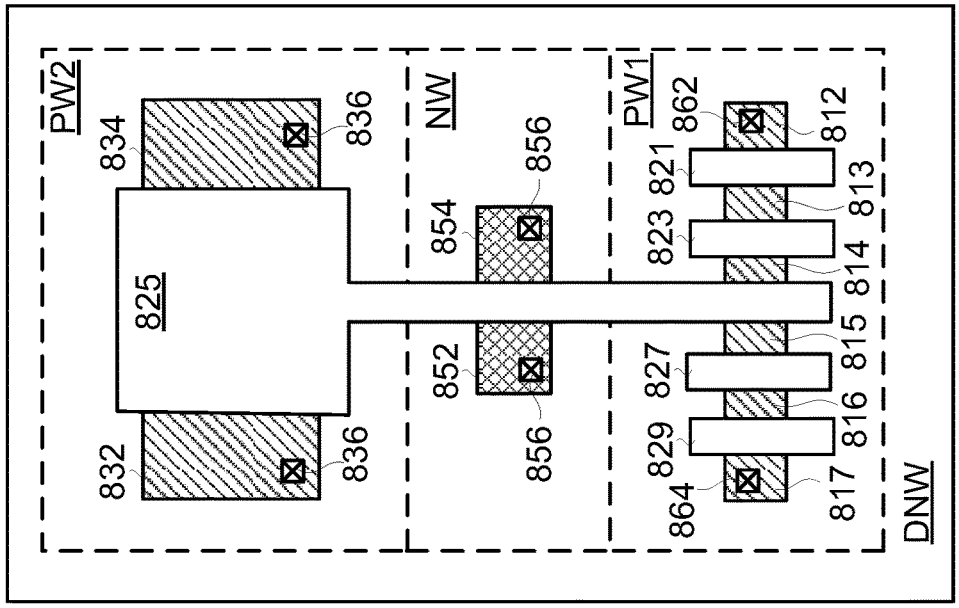
FIG. 8A

FIG. 9B

| | CL | WL2 | AG2 | WL1 | AG1 | EL | BL | SL | Descriptions |
|---|---|---|---|---|---|---|---|---|---|
| I | Vpp | Vp1 | Vp2 | Vp3 | Vp4 | Vpp | 0V | 0V | Selected row-program action |
| II | Vpp | Vp1 | Vp2 | Vp3 | Vp4 | Vpp | Vp5 | Vp6 | Selected row-program inhibition |
| III | 0V | 0V | 0V | 0V | 0V | 0V | 0V | 0V | Unselected row |
| IV | 0V | 0V | 0V | 0V | 0V | 0V | Vp5 | Vp6 | Unselected row |

FIG. 9C

| | CL | WL2 | AG2 | WL1 | AG1 | EL | BL | SL | Descriptions |
|---|---|---|---|---|---|---|---|---|---|
| V | 0V | Ve1 | Ve2 | Ve3 | Ve4 | Vee | 0V | 0V | Selected row |
| VI | 0V | 0V | 0V | 0V | 0V | 0V | 0V | 0V | Unselected row |

FIG. 9D

| | CL | WL2 | AG2 | WL1 | AG1 | EL | BL | SL | Descriptions |
|---|---|---|---|---|---|---|---|---|---|
| VII | Vr5 | Vr1 | Vr2 | Vr3 | Vr4 | Vr6 | Vrr | 0V | Selected row-bit line is selected |
| VIII | Vr5 | Vr1 | Vr2 | Vr3 | Vr4 | Vr6 | 0V/floating | 0V | Selected row-bit line is unselected |
| IX | 0V | 0V | 0V | 0V | 0V | 0V | Vrr | 0V | Unselected row |
| X | 0V | 0V | 0V | 0V | 0V | 0V | 0V/floating | 0V | Unselected row |

NON-VOLATILE MEMORY

This application claims the benefit of U.S. provisional patent application No. 62/444,379, filed Jan. 10, 2017, the subject matter of which is incorporated herein by reference.

FIELD OF THE INVENTION

The present invention relates to a non-volatile memory, and more particularly to a programmable non-volatile memory.

BACKGROUND OF THE INVENTION

FIG. 1A is a schematic cross-sectional view illustrating a memory cell of a conventional non-volatile memory. FIG. 1B is a circuit diagram illustrating an equivalent circuit of the memory cell of FIG. 1A. Each memory cell of the conventional non-volatile memory comprises three serially-connected n-type transistors M1, M2 and M3, which are constructed in a p-well region PW. Moreover, the memory cell is separated from the adjacent memory cells through shallow trench isolation (STI) structures 102 and 104.

A first n-type doped region 112, a second n-type doped region 114, a third n-type doped region 116 and a fourth n-type doped region 118 are formed in the p-well region PW. A first gate 122 is spanned over the first n-type doped region 112 and the second n-type doped region 114. A second gate 124 is spanned over the second n-type doped region 114 and the third n-type doped region 116. A third gate 126 is spanned over the third n-type doped region 116 and the fourth n-type doped region 118.

The first n-type transistor M1 is a select transistor. The first gate 122 of the first n-type transistor M1 is connected with a first word line WL1. The first n-type doped region 112 is connected with a bit line BL. The second n-type doped region 114 is a combination of the n-type doped region of the first n-type transistor M1 and the n-type doped region of the second n-type transistor M2.

The second n-type transistor M2 is a floating gate transistor. The second gate 124 of the second n-type transistor M2 is a floating gate. A capacitor C is connected between a control line CL and the floating gate. The third n-type doped region 116 is a combination of the n-type doped region of the second n-type transistor M2 and the n-type doped region of the third n-type transistor M3.

The third n-type transistor M3 is a select transistor. The third gate 126 is connected with a second word line WL2. The fourth n-type doped region 118 is connected with a source line SL.

FIG. 2 schematically illustrates associated bias voltages for programming the conventional non-volatile memory.

Before the program action on the memory cell is performed, a first word line voltage Vw1 provided to the first word line WL1 is 3.3V, a second word line voltage Vw2 provided to the second word line WL2 is 3.3V, a control line voltage Vc provided to the control line CL is 3.3V, a bit line voltage Vb provided to the bit line BL is 0V, a source line voltage Vs provided to the source line SL is 0V, and the p-well region PW receives a ground voltage (0V). Meanwhile, the first n-type transistor M1 and the third n-type transistor M3 are turned on. Consequently, the voltages of the n-type doped regions 112, 114, 116 and 118 are all 0V.

Please refer to FIG. 2. When the program action on the memory cell is started, only the control line voltage Vc is increased to 10V and the voltages at the other terminals are kept unchanged. Meanwhile, the voltage difference between the control line voltage Vc and the two n-type doped regions 114 and 116 is about 10V. Consequently, a gate oxide layer of the second n-type transistor M2 (i.e., the floating gate transistor) results in a Fowler-Nordheim tunneling effect (i.e., the FN tunneling effect), and the carriers are injected from a channel region of the second n-type transistor M2 into the second gate 124. After the memory cell is programmed, the carrier is stored in the floating gate of the floating gate transistor. The carriers are electrons.

FIG. 3A schematically illustrates associated bias voltages for performing a program inhibition on the conventional non-volatile memory. FIG. 3B schematically illustrates the voltage change of the n-doped region of the memory cell of the conventional non-volatile memory.

Before the program inhibition is performed on the memory cell, the first word line voltage Vw1 provided to the first word line WL1, the second word line voltage Vw2 provided to the second word line WL2, the control line voltage Vc provided to the control line CL, the bit line voltage Vb provided to the bit line BL and the source line voltage Vs provided to the source line SL are all 3.3V, and the p-well region PW receives a ground voltage (0V). Meanwhile, the first n-type transistor M1 and the third n-type transistor M3 are turned off. Consequently, the voltages applied to the n-type doped regions 112 and 118 are 3.3V. Moreover, the n-type doped regions 114 and 116 are in a floating state, and the voltages of the n-type doped regions 114 and 116 are equal to (3.3V−Vth), wherein Vth is a threshold voltage of the select transistors M1 and M3.

Please refer to FIG. 3A. When the program inhibition on the memory cell is started, only the control line voltage Vc is increased to 10V and the voltages at the other terminals are kept unchanged. Since the n-type doped regions 114 and 116 are in the floating state, the voltages of the n-type doped regions 114 and 116 are boosted from (3.3V−Vth) to a boost voltage. The boost voltage is slightly lower than Vc. For example, the boost voltage is about 8.5V. Meanwhile, the voltage difference between the control line voltage Vc and the two n-type doped regions 114 and 116 is 1.5V. Consequently, the gate oxide layer of the second n-type transistor M2 (i.e., the floating gate transistor) does not result in the FN tunneling effect, and no carriers are injected into the floating gate.

Moreover, the voltages provided to the n-type doped regions 112, 114, 116 and 118 are positive voltages, and the voltage provided to the p-well region PW is 0V. Consequently, a depletion region 132 is formed between these n-type doped regions and the p-well region PW. Moreover, a drain-gate voltage Vdg (e.g., 8.5V−3.3V) between the first gate 122 and the second n-type doped region 114 of the first n-type transistor M1 results in a gate-induced drain leakage (GIDL) current i1. Similarly, a drain-gate voltage Vdg between the third gate 126 and the third n-type doped region 116 of the third n-type transistor M3 results in a GIDL current i2. Because of the GIDL current i1 and the GIDL current i2, the boost voltages of the n-type doped regions 114 and 116 decrease.

Please refer to FIG. 3B. At the time point ta, the control line voltage Vc is increased to 10V. Consequently, the voltages of the n-type doped regions 114 and 116 are increased to 8.5V. Because of the GIDL current i1 and the GIDL current i2, the voltages of the n-type doped regions 114 and 116 are decreased from 8.5V. Accordingly, the voltage difference $\Delta V$ between the control line voltage Vc and the n-type doped regions 114 and 116 is gradually increased. If the voltage difference $\Delta V$ is too large, the second n-type transistor M2 (i.e., the floating gate transistor)

possibly results in the FN tunneling effect. Under this circumstance, the memory cell is erroneously programmed.

As mentioned above, the memory cell is adversely affected by the GIDL current i1 and the GIDL current i2 while the program inhibition is performed. In other words, the possibility of erroneously programming the memory cell is increased.

SUMMARY OF THE INVENTION

An object of the present invention provides a non-volatile memory. While the program inhibition is performed, the GIDL is effectively reduced. Consequently, the problem of erroneously programming the memory cell is avoided.

An embodiment of the present invention provides a non-volatile memory. The non-volatile memory includes a first memory cell. The first memory cell includes five transistors and a first capacitor. The first transistor includes a first gate, a first terminal and a second terminal. The second transistor includes a second gate, a third terminal and a fourth terminal. The third transistor includes a third gate, a fifth terminal and a sixth terminal. The fourth transistor includes a fourth gate, a seventh terminal and an eighth terminal. The fifth transistor includes a fifth gate, a ninth terminal and a tenth terminal. The first capacitor is connected between the third gate and a control line. The third gate is a floating gate. The second terminal is connected with the third terminal. The fourth terminal is connected with the fifth terminal. The sixth terminal is connected with the seventh terminal. The eighth terminal is connected with the ninth terminal.

An embodiment of the present invention provides a non-volatile memory. The non-volatile memory includes a first word line, a second word line, a first auxiliary line, a second auxiliary line, a first control line, a first erase line, a first bit line, a first source line and a first memory cell. The first memory cell includes a first transistor, a second transistor, a third transistor, a fourth transistor, a fifth transistor, a first capacitor and a second capacitor. The first transistor includes a first gate, a first terminal and a second terminal. The second transistor includes a second gate, a third terminal and a fourth terminal. The third transistor includes a third gate, a fifth terminal and a sixth terminal. The fourth transistor includes a fourth gate, a seventh terminal and an eighth terminal. The fifth transistor includes a fifth gate, a ninth terminal and a tenth terminal. The first capacitor is connected between the third gate and the control line. The second capacitor is connected with the third gate and the first erase line. The third gate is a floating gate. The second terminal is connected with the third terminal. The fourth terminal is connected with the fifth terminal. The sixth terminal is connected with the seventh terminal. The eighth terminal is connected with the ninth terminal. The first terminal is connected with the first bit line. The tenth terminal is connected with the first source line. The first gate is connected with the first word line. The second gate is connected with the first auxiliary line. The fourth gate is connected with the second auxiliary line. The fifth gate is connected with the second word line.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 4A is a schematic cross-sectional view illustrating a memory cell of a non-volatile memory according to a first embodiment of the present invention;

FIG. 4B is a circuit diagram illustrating an equivalent circuit of the memory cell of FIG. 4A;

FIG. 5 schematically illustrates associated bias voltages for programming the non-volatile memory according to the first embodiment of the present invention;

FIG. 7A is a schematic top view illustrating a memory cell of a non-volatile memory according to a second embodiment of the present invention;

FIG. 7B is a circuit diagram illustrating an equivalent circuit of the memory cell of FIG. 7A;

FIG. 7C is a bias voltage table illustrating the bias voltages for performing a program action, a program inhibition, an erase action and a read action on the memory cell of the non-volatile memory according to the second embodiment of the present invention;

FIG. 8A is a schematic top view illustrating a memory cell of a non-volatile memory according to a third embodiment of the present invention;

FIG. 8B is a circuit diagram illustrating an equivalent circuit of the memory cell of FIG. 8A;

FIG. 8C is a bias voltage table illustrating the bias voltages for performing a program action, a program inhibition, an erase action and a read action on the memory cell of the non-volatile memory according to the third embodiment of the present invention;

FIGS. 9B, 9C and 9D are bias voltage tables illustrating the bias voltages for performing various actions on the non-volatile memory of FIG. 9A.

DETAILED DESCRIPTION OF PREFERRED EMBODIMENTS

Figure 1A:
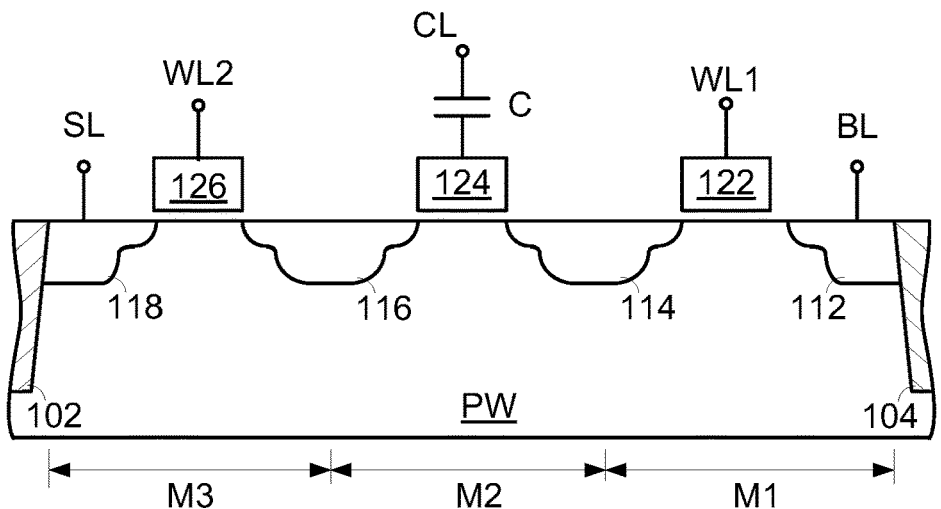
FIG. 1A (prior art) is a schematic cross-sectional view illustrating a memory cell of a conventional non-volatile memory.
Figure 1B:
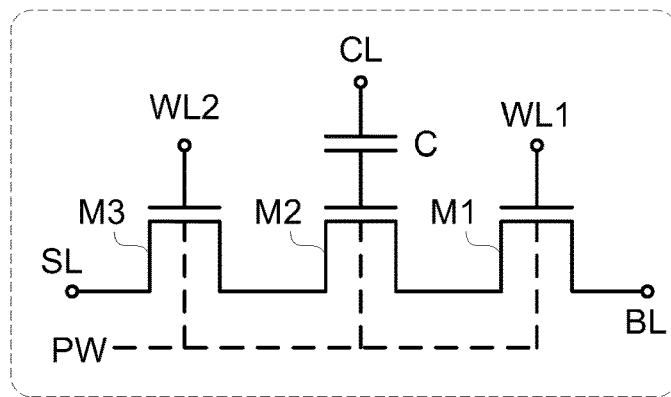
FIG. 1B (prior art) is a circuit diagram illustrating an equivalent circuit of the memory cell of FIG. 1A schematically illustrates a conventional dual-band system.

Generally, the magnitude of the GIDL current of the transistor is related to the magnitude of the drain-gate voltage Vdg of the transistor. The present invention provides a non-volatile memory. While the program inhibition is performed, the GIDL current is effectively reduced. Consequently, the problem of erroneously programming the memory cell is avoided.

FIG. 4A is a schematic cross-sectional view illustrating a memory cell of a non-volatile memory according to a first embodiment of the present invention. FIG. 4B is a circuit diagram illustrating an equivalent circuit of the memory cell of FIG. 4A. Each memory cell of the non-volatile memory comprises five serially-connected n-type transistors M1, M2, M3, M4 and M5, which are constructed in a p-well region PW. Moreover, the memory cell is separated from the adjacent memory cells through shallow trench isolation (STI) structures 202 and 204.

A first n-type doped region 212, a second n-type doped region 213, a third n-type doped region 214, a fourth n-type doped region 215, a fifth n-type doped region 216 and a sixth n-type doped region 217 are formed in the p-well region PW. A first gate 221 is spanned over the first n-type doped region 212 and the second n-type doped region 213. A second gate 223 is spanned over the second n-type doped region 213 and the third n-type doped region 214. A third gate 225 is spanned over the third n-type doped region 214 and the fourth n-type doped region 215. A fourth gate 227 is spanned over the fourth n-type doped region 215 and the fifth n-type doped region 216. A fifth gate 229 is spanned over the fifth n-type doped region 216 and the sixth n-type doped region 217.

The first n-type transistor M1 is a select transistor. The first gate 221 of the first n-type transistor M1 is connected with a first word line WL1. The first n-type doped region 212 is connected with a bit line BL. The second n-type doped region 213 is a combination of the n-type doped region of the first n-type transistor M1 and the n-type doped region of the second n-type transistor M2.

The second n-type transistor M2 is an auxiliary transistor. The second gate 223 of the second n-type transistor M2 is connected with a first auxiliary line AG1. The third n-type doped region 214 is a combination of the n-type doped region of the second n-type transistor M2 and the n-type doped region of the third n-type transistor M3.

The third n-type transistor M3 is a floating gate transistor. The third gate 225 of the third n-type transistor M3 is a floating gate. A capacitor C is connected between a control line CL and the third gate 225. The fourth n-type doped region 215 is a combination of the n-type doped region of the third n-type transistor M3 and the n-type doped region of the fourth n-type transistor M4.

The fourth n-type transistor M4 is an auxiliary transistor. The fourth gate 227 of the fourth n-type transistor M4 is connected with a second auxiliary line AG2. The fifth n-type doped region 216 is a combination of the n-type doped region of the fourth n-type transistor M4 and the n-type doped region of the fifth n-type transistor M5.

The fifth n-type transistor M5 is a select transistor. The fifth gate 229 is connected with a second word line WL2. The sixth n-type doped region 217 is connected with a source line SL.

Please refer to the equivalent circuit of FIG. 4B. The first n-type transistor M1 comprises a first gate, a first terminal and a second terminal. The second n-type transistor M2 comprises a second gate, a third terminal and a fourth terminal. The third n-type transistor M3 comprises a third gate, a fifth terminal and a sixth terminal. The fourth n-type transistor M4 comprises a fourth gate, a seventh terminal and an eighth terminal. The fifth n-type transistor M5 comprises a fifth gate, a ninth terminal and a tenth terminal.

As mentioned above, the five n-type transistors M1~M5 are connected with each other in series. Consequently, the second terminal is connected with the third terminal, the fourth terminal is connected with the fifth terminal, the sixth terminal is connected with the seventh terminal, and the eighth terminal is connected with the ninth terminal. Moreover, the capacitor C is connected between the third gate and the control line CL.

The first gate is connected with the first word line WL1. The second gate is connected with the first auxiliary line AG1. The third gate is floating gate. The fourth gate is connected with the second auxiliary line AG2. The fifth gate is connected with the second word line WL2.

FIG. 5 schematically illustrates associated bias voltages for programming the non-volatile memory according to the first embodiment of the present invention.

Before the program action is performed on the memory cell, a first auxiliary voltage Vag1 provided to the first auxiliary line AG1 is 5V, a second auxiliary voltage Vag2 provided to the second auxiliary line AG2 is 5V, a first word line voltage Vw1 provided to the first word line WL1 is 3.3V, a second word line voltage Vw2 provided to the second word line WL2 is 3.3V, a control line voltage Vc provided to the control line CL is 3.3V, a bit line voltage Vb provided to the bit line BL is 0V, a source line voltage Vs provided to the source line SL is 0V, and the p-well region PW receives a ground voltage (0V). Meanwhile, the first n-type transistor M1, the second n-type transistor M2, the fourth n-type transistor M4 and the fifth n-type transistor M5 are turned on. Consequently, the voltages of the n-type doped regions 212, 213, 214, 215, 216 and 217 are all 0V.

Please refer to FIG. 5. When the program action on the memory cell is started, only the control line voltage Vc is increased to 10V and the voltages at the other terminals are kept unchanged. Meanwhile, the voltage difference between the control line voltage Vc and the two n-type doped regions 214 and 215 is about 10V. Consequently, a gate oxide layer of the third n-type transistor M3 (i.e., the floating gate transistor) results in the FN tunneling effect, and the carriers are injected from a channel region of the third n-type transistor M3 into the third gate 225. After the memory cell is programmed, the carrier is stored in the floating gate of the floating gate transistor. The carriers are electrons.

Figure 6A:
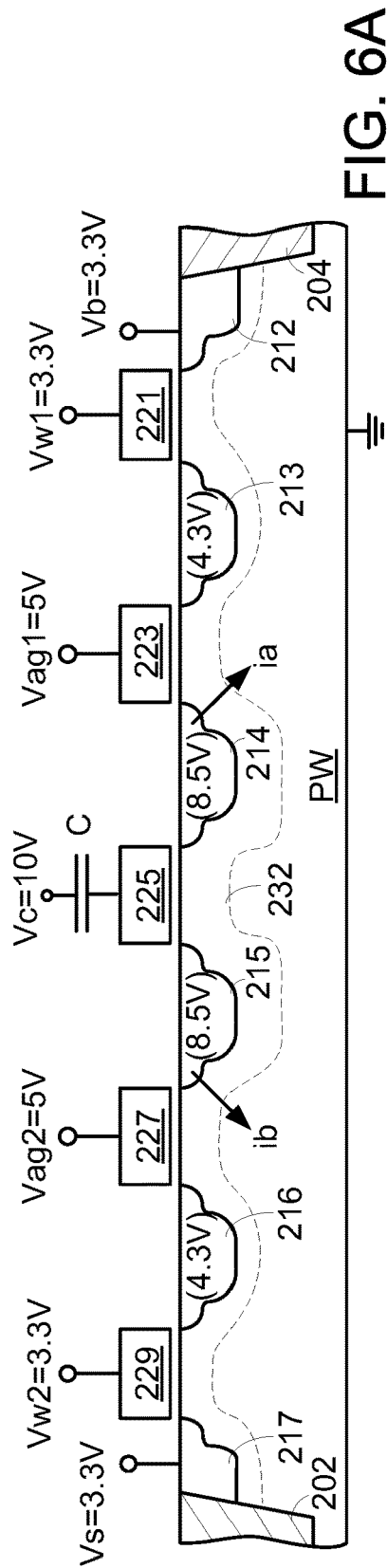
FIG. 6A schematically illustrates associated bias voltages for performing a program inhibition on the non-volatile memory according to the first embodiment of the present invention.
Figure 6B:
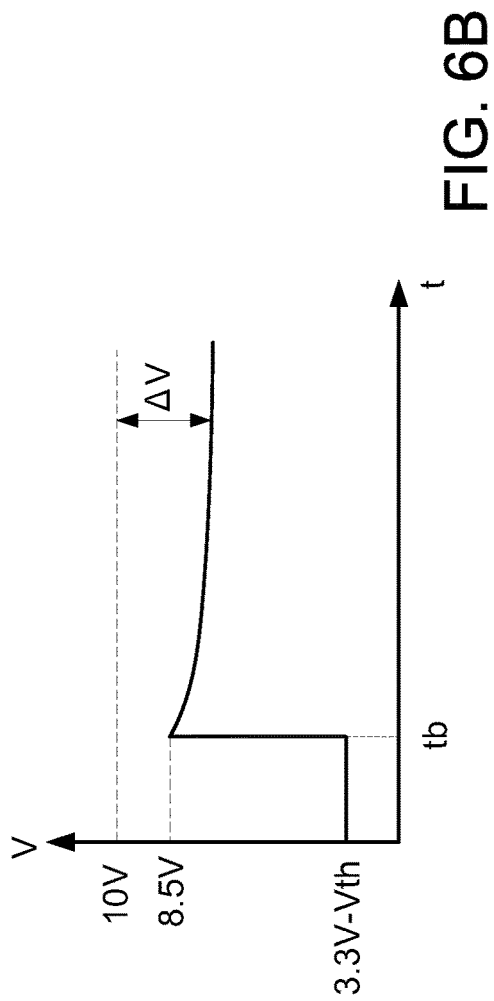
FIG. 6B schematically illustrates the voltage change of the n-doped region of the memory cell of the non-volatile memory according to the first embodiment of the present invention.

FIG. 6A schematically illustrates associated bias voltages for performing a program inhibition on the non-volatile memory according to the first embodiment of the present invention. FIG. 6B schematically illustrates the voltage change of the n-doped region of the memory cell of the non-volatile memory according to the first embodiment of the present invention.

Before the program inhibition is performed on the memory cell, the first auxiliary voltage Vag1 provided to the first auxiliary line AG1 is 5V, the second auxiliary voltage Vag2 provided to the second auxiliary line AG2 is 5V, the first word line voltage Vw1 provided to the first word line WL1 is 3.3V, the second word line voltage Vw2 provided to the second word line WL2 is 3.3V, the control line voltage Vc provided to the control line CL is 3.3V, the a bit line voltage Vb provided to the bit line BL is 3.3V, the source line voltage Vs provided to the source line SL is 3.3V, and the p-well region PW receives the ground voltage (0V). Meanwhile, the first n-type transistor M1 and the fifth n-type transistor M5 are turned off. Consequently, the voltages applied to the n-type doped regions 212 and 217 are 3.3V. Moreover, the n-type doped regions 213, 214, 215 and 216 are in a floating state.

Please refer to FIG. 6A. When the program inhibition on the memory cell is started, only the control line voltage Vc is increased to 10V and the voltages at the other terminals are kept unchanged. Since the n-type doped regions 213, 214, 215 and 216 are in the floating state, the voltages of the n-type doped regions 214 and 215 are boosted to about 8.5V and the voltages of the n-type doped regions 213 and 216 are boosted to about 4.3V. Meanwhile, the voltage difference between the control line voltage Vc and the two n-type doped regions 214 and 215 is about 1.5V. Consequently, the gate oxide layer of the third n-type transistor M3 (i.e., the floating gate transistor) does not result in the FN tunneling effect, and no carriers are injected into the floating gate.

Moreover, the voltages provided to the n-type doped regions 212, 213, 214, 215, 216 and 217 are positive voltages, and the voltage provided to the p-well region PW is 0V. Consequently, a depletion region 232 is formed between these n-type doped regions and the p-well region PW.

Moreover, a drain-gate voltage Vdg (e.g., 8.5V–5V) between the second gate 223 and the third n-type doped region 214 of the second n-type transistor M2 results in a GIDL current ia. Similarly, a drain-gate voltage Vdg (e.g., 8.5V–5V) between the fourth gate 227 and the fourth n-type doped region 215 of the fourth n-type transistor M4 results in a GIDL current ib.

Figure 2:
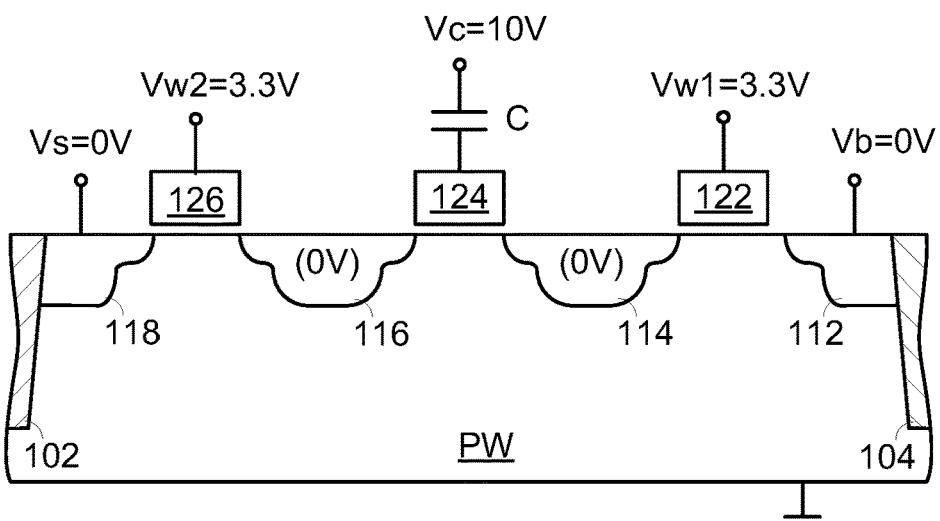
FIG. 2 (prior art) schematically illustrates associated bias voltages for programming the conventional non-volatile memory.
Figure 3A:
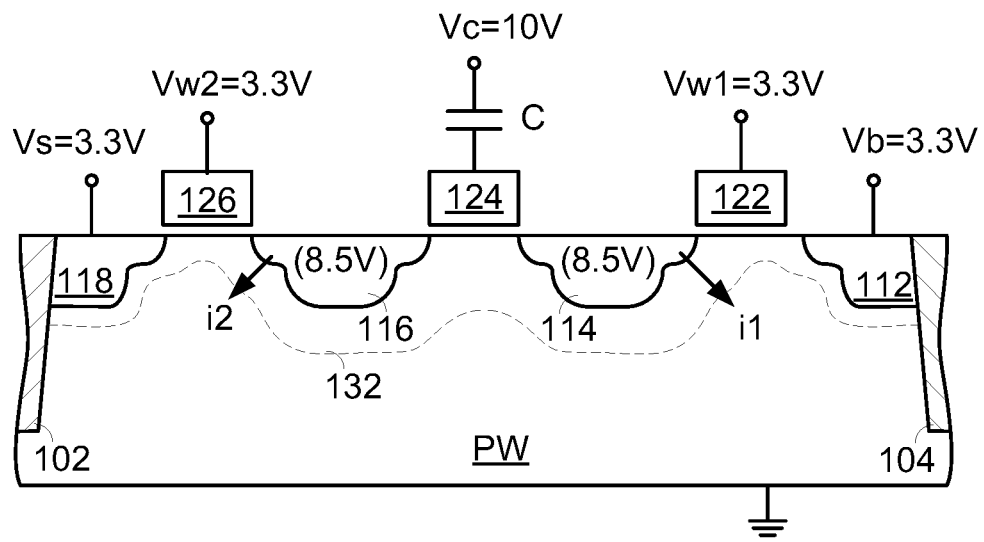
FIG. 3A (prior art) schematically illustrates associated bias voltages for performing a program inhibition on the conventional non-volatile memory.
Figure 3B:
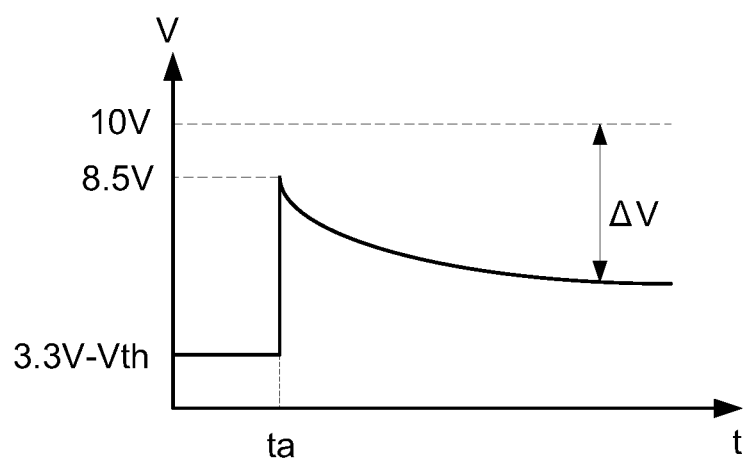
FIG. 3B (prior art) schematically illustrates the voltage change of the n-doped region of the memory cell of the conventional non-volatile memory.

In comparison with the conventional memory cell of FIG. 2, the drain-gate voltage Vdg of the transistor in the memory cell of the present invention is lower. Consequently, when the program inhibition is performed on the memory cell, the GIDL current ia and the GIDL current ib are lower.

Please refer to FIG. 6B. At the time point tb, the control line voltage Vc is increased to 10V. Consequently, the voltages of the n-type doped regions 214 and 215 are increased to 8.5V. Since the GIDL current ib and the GIDL current ib are lower, the voltage difference ΔV between the control line voltage Vc and the n-type doped regions 214 and 215 is very small. Since the FN tunneling effect is not generated, the memory cell will not be erroneously programmed.

From the above description, the preset invention provides a novel non-volatile memory. While the program inhibition is performed, the GIDL current is effectively reduced. Consequently, the problem of erroneously programming the memory cell is avoided. In the first embodiment, the bias voltages provided to the memory cell are presented herein for purpose of illustration and description only. It is noted that the bias voltages provided to the memory cell may be altered according to the practical requirements.

FIG. 7A is a schematic top view illustrating a memory cell of a non-volatile memory according to a second embodiment of the present invention. FIG. 7B is a circuit diagram illustrating an equivalent circuit of the memory cell of FIG. 7A. Similarly, the program action and the program inhibition can be performed on the memory cell of the non-volatile memory of this embodiment. In addition, an erase action can be performed on the memory cell of the non-volatile memory of this embodiment.

Firstly, a p-well region PW, a first n-well region NW1 and a second n-well region NW2 are formed in a semiconductor substrate. Moreover, four gates 721, 723, 727 and 729 are located over the p-well region PW, and a gate 725 is located over the p-well region PW, the first n-well region NW1 and the second n-well region NW2.

Then, a p-type ion implantation process is performed by using the gate 725 as an implantation mask. Consequently, p-type doped regions 732 and 734 are formed in the first n-well region NW1, and p-type doped regions 752 and 754 are formed in the second n-well region NW2. Then, an n-type ion implantation process is performed by using the gates 721, 723, 725, 727 and 729 as the implantation masks. Consequently, n-type doped regions 712, 713, 714, 715, 716 and 717 are formed in the p-well region PW.

Moreover, a conductor line 762 is connected with the n-type doped region 712, a conductor 764 is connected with the n-type doped region 717, a conductor line 736 is connected with the p-type doped regions 732 and 734, and a conductor line 756 is connected with the p-type doped regions 752 and 754.

The structure of the non-volatile memory of this embodiment in the p-well region PW is similar to that of the non-volatile memory of FIG. 4A. That is, the structure of the non-volatile memory in the p-well region PW comprises five serially-connected transistors M1~M5. The conductor line 762 is used as a bit line BL. The first gate 721 is connected with a first word line WL1. The second gate 723 is connected with a first auxiliary line AG1. The third gate 725 is floating gate. The fourth gate 727 is connected with a second auxiliary line AG2. The fifth gate 729 is connected with a second word line WL2. The conductor line 764 is used as a source line SL.

The third gate 725 (i.e., the floating gate) is extended to the first n-well region NW1. Moreover, the third gate 725 and the p-type doped regions 732 and 734 are collaboratively defined as a p-type transistor. The conductor line 736 is connected with the drain terminal and the source terminal of this p-type transistor to define a capacitor Cc. That is, a terminal of the capacitor Cc is connected with the third gate 725 (i.e., the floating gate), and the other terminal of the capacitor Cc is connected with the conductor line 736. Moreover, the conductor line 736 is used as a control line CL.

The third gate 725 (i.e., the floating gate) is also extended to the second n-well region NW2. Moreover, the third gate 725 and the p-type doped regions 752 and 754 are collaboratively defined as a p-type transistor. The conductor line 756 is connected with the drain terminal and the source terminal of this p-type transistor to define a capacitor Ce. That is, a terminal of the capacitor Ce is connected with the third gate 725 (i.e., the floating gate), and the other terminal of the capacitor Ce is connected with the conductor line 756. Moreover, the conductor line 756 is used as an erase line EL.

FIG. 7C is a bias voltage table illustrating the bias voltages for performing a program action, a program inhibition, an erase action and a read action on the memory cell of the non-volatile memory according to the second embodiment of the present invention. The program action and the program inhibition of this embodiment are similar to those of the first embodiment, and are not redundantly described herein.

When the program action (PGM) is performed, the voltage Vpp is provided to the control line CL, the erase line EL, the first n-well region NW1 and the second n-well region NW2, the voltage Vp1 is provided to the second word line WL2, the voltage Vp2 is provided to the second auxiliary line AG2, the voltage Vp3 is provided to the first word line WL1, the voltage Vp4 is provided to the first auxiliary line AG1, and the voltages provided to the bit line BL, the source line SL and the p-well region PW are 0V. The voltage Vpp is a program voltage, which has the highest voltage value. The voltage Vp2 is equal to the voltage Vp4. The voltage Vp1 is equal to the voltage Vp3. The voltage Vp2 is higher than or equal to the voltage Vp1. Moreover, the voltage Vp1 is higher than 0V.

When the program inhibition (PGM inhibit) is performed, the voltage Vpp is provided to the control line CL, the erase line EL, the first n-well region NW1 and the second n-well region NW2, the voltage Vi1 is provided to the second word line WL2, the voltage Vi2 is provided to the second auxiliary line AG2, the voltage Vi3 is provided to the first word line WL1, the voltage Vi4 is provided to the first auxiliary line AG1, the voltage Vi5 is provided to the bit line BL, the voltage Vi6 is provided to the source line SL, and voltage provided to the p-well region PW is 0V. The voltage Vpp has the highest voltage value. The voltage Vi2 is equal to the voltage Vi4. The voltage Vi1 is equal to the voltage Vi3. The voltage Vi5 is equal to the voltage Vi6. The voltage Vi2 is higher than or equal to the voltage Vi1. The voltage Vi1 is higher than or equal to the voltage Vi5. Moreover, the voltage Vi5 is higher than 0V.

When the erase action (ERS) is performed, the voltage Vee is provided to the erase line EL and the second n-well region NW2, the voltage Ve1 is provided to the second word line WL2, the voltage Ve2 is provided to the second auxiliary line AG2, the voltage Ve3 is provided to the first word line WL1, the voltage Ve4 is provided to the first auxiliary line AG1, and the voltages provided to the control line CL, the first n-well region NW1, the bit line BL, the source line SL and the p-well region PW are 0V. The voltage Vee is an erase voltage, which has the highest voltage value. The voltage Ve2 is equal to the voltage Ve4. The voltage Ve1 is equal to the voltage Ve3. The voltage Ve2 is higher than or equal to the voltage Ve1. Moreover, the voltage Ve1 is higher than 0V.

For example, the voltage Vee is 10V, the voltage Ve1 is 3.3V, and the voltage Ve2 is 5V. When the erase action is performed, the transistors M1, M2, M4 and M5 are turned on. In addition, the carriers stored in the third gate 725 (i.e., the floating gate) are tunneled through the capacitor Ce and ejected from the non-volatile memory through the erase line EL.

When the read action (READ) is performed, the voltage Vr1 is provided to the second word line WL2, the voltage Vr2 is provided to the second auxiliary line AG2, the voltage Vr3 is provided to the first word line WL1, the voltage Vr4 is provided to the first auxiliary line AG1, the voltage Vr5 is provided to the control line CL and the first n-well region NW1, the voltage Vr6 is provided to the erase line EL and the second n-well region NW2, the voltage Vrr is provided to the bit line BL, and the voltages provided to the source line SL and the p-well region PW are 0V. The voltage Vrr is a read voltage. The voltage Vr2 is equal to the voltage Vr4. The voltage Vr1 is equal to the voltage Vr3. The voltage Vr5 is equal to the voltage Vr6. The voltage Vr2 is higher than or equal to the voltage Vr1. Moreover, the voltage Vr5 is higher than or equal to 0V, and the voltage Vrr is higher than 0V.

For example, the voltage Vrr is 1V, the voltage Vr1 is 1.8V, the voltage Vr2 is 3.3V, and the voltage Vr5 is 0V. When the read action is performed, the transistors M1, M2, M4 and M5 are turned on. Depending on the on/off states of the transistor M3, the magnitude of the read current is determined. The read current is transmitted from the bit line BL to the source line SL. According to the magnitude of the read current, the storage state of the non-volatile memory is determined.

FIG. 8A is a schematic top view illustrating a memory cell of a non-volatile memory according to a third embodiment of the present invention. FIG. 8B is a circuit diagram illustrating an equivalent circuit of the memory cell of FIG. 8A.

Firstly, an n-well region NW, a first p-well region PW1 and a second p-well region PW2 are formed in a deep n-well region DNW. Moreover, four gates 821, 823, 827 and 829 are located over the first p-well region PW1, and a gate 825 is located over the first p-well region PW1, the n-well region NW and the second p-well region PW2.

Then, a p-type ion implantation process is performed by using the gate 825 as an implantation mask. Consequently, p-type doped regions 852 and 854 are formed in the n-well region NW. Then, an n-type ion implantation process is performed by using the gates 821, 823, 825, 827 and 829 as the implantation masks. Consequently, n-type doped regions 812, 813, 814, 815, 816 and 817 are formed in the first p-well region PW1, and n-type doped regions 832 and 834 are formed in the second p-well region PW2.

Moreover, a conductor line 862 is connected with the n-type doped region 812, a conductor 864 is connected with the n-type doped region 817, a conductor line 836 is connected with the n-type doped regions 832 and 834, and a conductor line 856 is connected with the p-type doped regions 852 and 854.

The structure of the non-volatile memory of this embodiment in the first p-well region PW1 is similar to that of the non-volatile memory of FIG. 4A. That is, the structure of the non-volatile memory in the first p-well region PW1 comprises five serially-connected transistors M1~M5. The conductor line 862 is used as a bit line BL. The first gate 821 is connected with a first word line WL1. The second gate 823 is connected with a first auxiliary line AG1. The third gate 825 is floating gate. The fourth gate 827 is connected with a second auxiliary line AG2. The fifth gate 829 is connected with a second word line WL2. The conductor line 864 is used as a source line SL.

The third gate 825 (i.e., the floating gate) is extended to the second p-well region PW2. Moreover, the third gate 825 and the n-type doped regions 832 and 834 are collaboratively defined as an n-type transistor. The conductor line 836 is connected with the drain terminal and the source terminal of this n-type transistor to define a capacitor Cc. That is, a terminal of the capacitor Cc is connected with the third gate 825 (i.e., the floating gate), and the other terminal of the capacitor Cc is connected with the conductor line 836. Moreover, the conductor line 836 is used as a control line CL.

The third gate 825 (i.e., the floating gate) is also extended to the n-well region NW. Moreover, the third gate 825 and the p-type doped regions 852 and 854 are collaboratively defined as a p-type transistor. The conductor line 856 is connected with the drain terminal and the source terminal of this p-type transistor to define a capacitor Ce. That is, a terminal of the capacitor Ce is connected with the third gate 825 (i.e., the floating gate), and the other terminal of the capacitor Ce is connected with the conductor line 856. Moreover, the conductor line 856 is used as an erase line EL.

FIG. 8C is a bias voltage table illustrating the bias voltages for performing a program action, a program inhibition, an erase action and a read action on the memory cell of the non-volatile memory according to the third embodiment of the present invention. When the program action, the program inhibition, the erase action or the read action is performed, the bias voltage provided to the n-well region NW and the bias voltage provided to the deep n-well region DWW are identical. The other bias voltages of FIG. 8C are similar to those of FIG. 7C, and are not redundantly described herein.

Figure 9A:
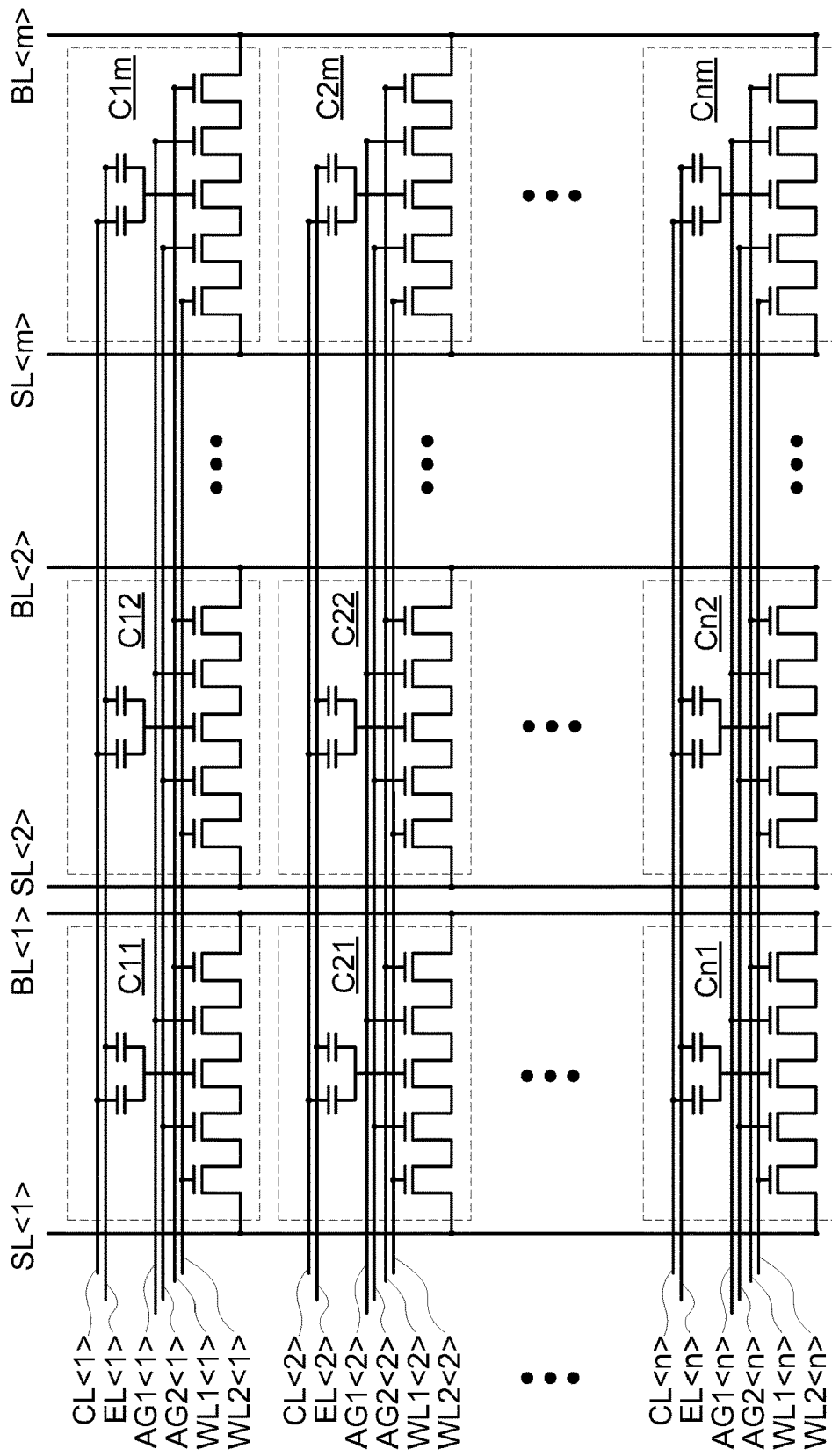
FIG. 9A is a schematic circuit diagram, illustrating a non-volatile memory according to an embodiment of the present invention.

FIG. 9A is a schematic circuit diagram, illustrating a non-volatile memory according to an embodiment of the present invention. FIGS. 9B, 9C and 9D are bias voltage tables illustrating the bias voltages for performing various actions on the non-volatile memory of FIG. 9A.

In this embodiment, the non-volatile memory comprises a memory cell array with plural memory cells C11~Cnm, which are arranged in an n×m array. The structure of each memory cell is identical to the memory cell of the second embodiment or the memory cell of the third embodiment, and is not redundantly described herein.

Each row of the memory cell array comprises m memory cells, which are controlled by a group of horizontal signal lines. For example, the memory cells C11~C1m in the first row of the memory cell array are control by a first group of horizontal signal lines. The first group of horizontal signal lines contain a first word line WL1<1>, a second word line WL2<1>, a first auxiliary line AG1<1>, a second auxiliary line AG2<1>, a control line CL<1> and an erase line EL<1>. For simplifying the circuitry, the first word line WL1 and the second word line WL2 in the same row are connected with each other, and the first auxiliary line AG1 and the second auxiliary line AG2 in the same row are connected with each other.

Similarly, the memory cells Cn1~Cnm in the n-th row of the memory cell array are control by an n-th group of horizontal signal lines. The n-th group of horizontal signal lines contain a first word line WL1<n>, a second word line WL2<n>, a first auxiliary line AG1<n>, a second auxiliary line AG2<n>, a control line CL<n> and an erase line EL<n>.

Each column of the memory cell array comprises n memory cells, which are controlled by a group of vertical signal lines. For example, the memory cells C11~Cn1 in the first column of the memory cell array are control by a first group of vertical signal lines. The first group of vertical signal lines contain a bit line BL<1> and a source line SL<1>.

Similarly, the memory cells C1m~Cnm in the m-th column of the memory cell array are control by an m-th group of vertical signal lines. The m-th group of vertical signal lines contain a bit line BL<m> and a source line SL<m>.

For example, if the first row of the memory cell array is the selected row, the other rows are unselected row. Under this circumstance, all of the memory cells in the first row can be subjected to the program action or the program inhibition.

Please refer to FIG. 9B. While the program action is performed on the memory cell C11, the bias voltages provided to the memory cell C11 are listed in the situation I. While the program inhibition is performed on the memory cell C12, the bias voltages provided to the memory cell C12 are listed in the situation II. The rest may be deduced by analogy.

While the program action is performed on the memory cell C11, the bias voltages provided to the other memory cells C21~Cn1 in the first column are listed in the situation III. Moreover, while the program inhibition is performed on the memory cell C12, the bias voltages provided to the other memory cells C22~Cn2 in the second column are listed in the situation IV. The rest may be deduced by analogy.

Please refer to FIG. 9C. For erasing the second row of the memory cell array, the second row is the selected row and the other rows are unselected rows. The bias voltages provided to all memory cells C21~C2m in the second row are listed in the situation V. According to these bias voltages, the erase action is performed on all of the memory cells C21~C2m. Moreover, the bias voltages provided to the memory cells in the other rows are listed in the situation VI, and thus the erase action is not performed.

Moreover, if the first row of the memory cell array is the first row and the other rows are unselected rows, the memory cells C11~C1m in the selected row generate read currents according to the result of judging whether the corresponding bit lines are selected. In case that the bit line receives the voltage Vrr, the bit line is selected. In case that the bit line receives 0V or the bit line is in the floating state, the bit line is unselected.

Please refer to FIG. 9D. If the bit line corresponding to the memory cell C11 is selected, the bias voltages provided to the memory cell C11 are listed in the situation VII. Meanwhile, the read current is generated. If the bit line corresponding to the memory cell C12 is unselected, the bias voltages provided to the memory cell C12 are listed in the situation VIII. Meanwhile, the read current is not generated. The rest may be deduced by analogy.

If the bit line corresponding to the memory cell C11 is selected, the bias voltages provided to the other memory cells C21~Cn1 in the first column are listed in the situation IX. Meanwhile, the read current is not generated. If the bit line corresponding to the memory cell C12 is unselected, the bias voltages provided to the other memory cells C22~Cn2 are listed in the situation X. Meanwhile, the read current is not generated. The rest may be deduced by analogy.

From the above descriptions, the present invention provides a non-volatile memory. While the program inhibition is performed, the GIDL current is effectively reduced. Consequently, the problem of erroneously programming the memory cell is avoided.

In the above embodiments, the five serially-connected transistors M1~M5 are n-type transistors. It is noted that numerous modifications and alterations may be made while retaining the teachings of the invention. For example, in another embodiment, the five serially-connected transistors M1~M5 are p-type transistors. Similarly, the capacitors Cc and Ce may be implemented with n-type transistors or p-type transistors.

For achieving efficient operations of the memory cell, the structures of the five serially-connected transistors M1~M5 may be further modified. For example, the gate oxide layers of the first n-type transistor M1 and the fifth n-type transistor M5 are thinner, and the gate oxide layers of the second n-type transistor M2, the third n-type transistor M3 and the fourth n-type transistor M4 are thicker. For example, the gate oxide layer in each of the second n-type transistor M2, the third n-type transistor M3 and the fourth n-type transistor M4 has a first thickness d1, and the gate oxide layer in each of the first n-type transistor M1 and the fifth n-type transistor M5 has a second thickness d2. The first thickness d1 is larger than the second thickness d2. As mentioned above, the capacitors Cc and Ce are implemented with transistors (e.g., a sixth transistor and a seventh transistor). In an embodiment, the gate oxide layer in each of the sixth transistor and the seventh transistor has the first thickness d1. That is, the thickness of the gate oxide layer in each of the sixth transistor and the seventh transistor is identical to the thickness of the gate oxide layer in the third n-type transistor M3.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory comprising a first memory cell, the first memory cell comprising:
   a first transistor comprising a first gate, a first terminal and a second terminal;
   a second transistor comprising a second gate, a third terminal and a fourth terminal;
   a third transistor comprising a third gate, a fifth terminal and a sixth terminal;
   a fourth transistor comprising a fourth gate, a seventh terminal and an eighth terminal;
   a fifth transistor comprising a fifth gate, a ninth terminal and a tenth terminal; and
   a first capacitor connected between the third gate and a control line,
   wherein the third gate is a floating gate, the second terminal is connected with the third terminal, the fourth terminal is connected with the fifth terminal, the sixth terminal is connected with the seventh terminal, and the eighth terminal is connected with the ninth terminal; and
   wherein the first terminal is connected with a first bit line, the tenth terminal is connected with a first source line, the first gate is connected with a first word line, the second gate is connected with a first auxiliary line, the fourth gate is connected with a second auxiliary line, and the fifth gate is connected with a second word line.

2. The non-volatile memory as claimed in claim 1, wherein the first transistor, the second transistor, the third transistor, the fourth transistor and the fifth transistor are n-type transistors.

3. The non-volatile memory as claimed in claim 1, wherein the first memory cell further comprises a second capacitor, and the second capacitor is connected with the third gate and an erase line.

4. The non-volatile memory as claimed in claim 3, wherein the first capacitor is composed of a sixth transistor, and the second capacitor is composed of a seventh transistor, wherein the sixth transistor comprises a sixth gate, an eleventh terminal and a twelfth terminal, and the seventh transistor comprises a seventh gate, a thirteenth terminal and a fourteenth terminal, wherein both of the sixth gate and the seventh gate are connected with the third gate, both of the eleventh terminal and the twelfth terminal are connected with the control line, and both of the thirteenth terminal and the fourteenth terminal are connected with the erase line.

5. The non-volatile memory as claimed in claim 4, wherein a gate oxide layer in each of the third transistor, the sixth transistor and the seventh transistor has a first thickness.

6. The non-volatile memory as claimed in claim 5, wherein a gate oxide layer in each of the first transistor and the fifth transistor has a second thickness, a gate oxide layer in each of the second transistor and the fourth transistor has the first thickness, wherein the first thickness is larger than the second thickness.

7. The non-volatile memory as claimed in claim 3, wherein when a program action is performed, a program voltage is provided to the control line and the erase line, a first voltage is provided to the second word line, a second voltage is provided to the second auxiliary line, a third voltage is provided to the first word line, a fourth voltage is provided to the first auxiliary line, and a ground voltage is provided to the bit line and the source line, wherein the program voltage is higher than the second voltage, the second voltage is equal to the fourth voltage, the first voltage is equal to the third voltage, the second voltage is higher than or equal to the first voltage, and the first voltage is higher than the ground voltage.

8. The non-volatile memory as claimed in claim 3, wherein when a program inhibition is performed, a program voltage is provided to the control line and the erase line, a first voltage is provided to the second word line, a second voltage is provided to the second auxiliary line, a third voltage is provided to the first word line, a fourth voltage is provided to the first auxiliary line, a fifth voltage is provided to the bit line, and a sixth voltage is provided to the source line, wherein the program voltage is higher than the second voltage, the second voltage is equal to the fourth voltage, the first voltage is equal to the third voltage, the fifth voltage is equal to the sixth voltage, the second voltage is higher than or equal to the first voltage, and the first voltage is higher than or equal to the fifth voltage.

9. The non-volatile memory as claimed in claim 3, wherein when an erase action is performed, an erase voltage is provided to the erase line, a first voltage is provided to the second word line, a second voltage is provided to the second auxiliary line, a third voltage is provided to the first word line, a fourth voltage is provided to the first auxiliary line, and a ground voltage is provided to the control line, the bit line and the source, wherein the erase voltage is higher than the second voltage, the second voltage is equal to the fourth voltage, the first voltage is equal to the third voltage, the second voltage is higher than or equal to the first voltage, and the first voltage is higher than the ground voltage.

10. The non-volatile memory as claimed in claim 3, wherein when a read action is performed, a read voltage is provided to the bit line, a first voltage is provided to the second word line, a second voltage is provided to the second auxiliary line, a third voltage is provided to the first word line, a fourth voltage is provided to the first auxiliary line, a fifth voltage is provided to the control line, a sixth voltage is provided to the erase line, and a ground voltage is provided to the source line, wherein the second voltage is equal to the fourth voltage, the first voltage is equal to the third voltage, the fifth voltage is equal to the sixth voltage, the second voltage is higher than or equal to the first voltage, the fifth voltage is higher than or equal to the ground voltage, and the read voltage is higher than the ground voltage.

11. A non-volatile memory, comprising:
   a first word line;
   a second word line;
   a first auxiliary line;
   a second auxiliary line;
   a first control line;
   a first erase line;
   a first bit line;
   a first source line; and
   a first memory cell comprising a first transistor, a second transistor, a third transistor, a fourth transistor, a fifth transistor, a first capacitor and a second capacitor, wherein the first transistor comprises a first gate, a first terminal and a second terminal, the second transistor includes a second gate, a third terminal and a fourth terminal, the third transistor comprises a third gate, a fifth terminal and a sixth terminal, the fourth transistor comprises a fourth gate, a seventh terminal and an eighth terminal, the fifth transistor comprises a fifth gate, a ninth terminal and a tenth terminal, the first capacitor is connected between the third gate and the control line, and the second capacitor is connected with the third gate and the first erase line;

wherein the third gate is a floating gate, the second terminal is connected with the third terminal, the fourth terminal is connected with the fifth terminal, the sixth terminal is connected with the seventh terminal, the eighth terminal is connected with the ninth terminal, the first terminal is connected with the first bit line, the tenth terminal is connected with the first source line, the first gate is connected with the first word line, the second gate is connected with the first auxiliary line, the fourth gate is connected with the second auxiliary line, and the fifth gate is connected with the second word line.

12. The non-volatile memory as claimed in claim 11, further comprising:
   a second bit line;
   a second source line; and
   a second memory cell comprising a sixth transistor, a seventh transistor, an eighth transistor, a ninth transistor, a tenth transistor, a third capacitor and a fourth capacitor, wherein the sixth transistor comprises a sixth gate, an eleventh terminal and a twelfth terminal, the seventh transistor includes a seventh gate, a thirteenth terminal and a fourteenth terminal, the eighth transistor comprises an eighth gate, a fifteenth terminal and a sixteenth terminal, the ninth transistor comprises a ninth gate, a seventeenth terminal and an eighteenth terminal, the tenth transistor comprises a tenth gate, a nineteenth terminal and a twentieth terminal, the third capacitor is connected between the eighth gate and the first control line, and the fourth capacitor is connected with the eighth gate and the first erase line,
   wherein the eighth gate is a floating gate, the twelfth terminal is connected with the thirteenth terminal, the fourteenth terminal is connected with the fifteenth terminal, the sixteenth terminal is connected with the seventeenth terminal, the eighteenth terminal is connected with the nineteenth terminal, the eleventh terminal is connected with the second bit line, the twentieth terminal is connected with the second source line, the sixth gate is connected with the first word line, the seventh gate is connected with the first auxiliary line, the ninth gate is connected with the second auxiliary line, and the tenth gate is connected with the second word line.

13. The non-volatile memory as claimed in claim 12, wherein the first word line and the second word line are connected with each other, and the first auxiliary line and the second auxiliary line are connected with each other.

14. The non-volatile memory as claimed in claim 12, further comprising:
   a third word line;
   a fourth word line;
   a third auxiliary line;
   a fourth auxiliary line;
   a second control line;
   a second erase line; and
   a third memory cell comprising an eleventh transistor, a twelfth transistor, a thirteenth transistor, a fourteenth transistor, a fifteenth transistor, a fifth capacitor and a sixth capacitor, wherein the eleventh transistor comprises an eleventh gate, a twenty-first terminal and a twenty-second terminal, the twelfth transistor includes a twelfth gate, a twenty-third terminal and a twenty-fourth terminal, the thirteenth transistor comprises a thirteenth gate, a twenty-fifth terminal and a twenty-sixth terminal, the fourteenth transistor comprises a fourteenth gate, a twenty-seventh terminal and a twenty-eighth terminal, the fifteenth transistor comprises a fifteenth gate, a twenty-ninth terminal and a thirtieth terminal, the fifth capacitor is connected between the thirteenth gate and the second control line, and the sixth capacitor is connected with the thirteenth gate and the second erase line,
   wherein the thirteenth gate is a floating gate, the twenty-second terminal is connected with the twenty-third terminal, the twenty-fourth terminal is connected with the twenty-fifth terminal, the twenty-sixth terminal is connected with the twenty-seventh terminal, the twenty-eighth terminal is connected with the twenty-ninth terminal, the twenty-first terminal is connected with the first bit line, the thirtieth terminal is connected with the first source line, the eleventh gate is connected with the third word line, the twelfth gate is connected with the third auxiliary line, the fourteenth gate is connected with the fourth auxiliary line, and the fifteenth gate is connected with the fourth word line.

15. The non-volatile memory as claimed in claim 12, wherein the third word line and the fourth word line are connected with each other, and the third auxiliary line and the fourth auxiliary line are connected with each other.

\* \* \* \* \*